(12) United States Patent
Eller et al.

(10) Patent No.: US 7,820,518 B2
(45) Date of Patent: Oct. 26, 2010

(54) TRANSISTOR FABRICATION METHODS AND STRUCTURES THEREOF

(75) Inventors: Manfred Eller, Beacon, NY (US); Jiang Yan, Newburgh, NY (US); Jin-Ping Han, Fishkill, NY (US); Alois Gutmann, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 81 days.

(21) Appl. No.: 12/129,510

(22) Filed: May 29, 2008

(65) Prior Publication Data
US 2009/0294866 A1    Dec. 3, 2009

(51) Int. Cl.
*H01L 21/336* (2006.01)
(52) U.S. Cl. ............. 438/303; 257/E21.324; 257/E21.438

(58) Field of Classification Search ............. 438/303, 438/393; 257/E21.324, E21.438
See application file for complete search history.

(56) References Cited

U.S. PATENT DOCUMENTS

| 2005/0158955 A1* | 7/2005 | Yang et al. ............. 438/282 |
| 2005/0224867 A1* | 10/2005 | Huang et al. ............. 257/327 |
| 2007/0196991 A1* | 8/2007 | Nandakumar et al. ...... 438/303 |
| 2007/0235823 A1* | 10/2007 | Hsu et al. ............. 257/411 |

* cited by examiner

*Primary Examiner*—Davienne Monbleau
*Assistant Examiner*—Matthew Reames
(74) *Attorney, Agent, or Firm*—Slater & Matsil, L.L.P.

(57) ABSTRACT

Methods of fabricating transistors and semiconductor devices and structures thereof are disclosed. In one embodiment, a method of fabricating a transistor includes forming a gate dielectric over a workpiece, forming a gate over the gate dielectric, and forming a stress-inducing material over the gate, the gate dielectric, and the workpiece. Sidewall spacers are formed from the stress-inducing material on sidewalls of the gate and the gate dielectric.

23 Claims, 9 Drawing Sheets

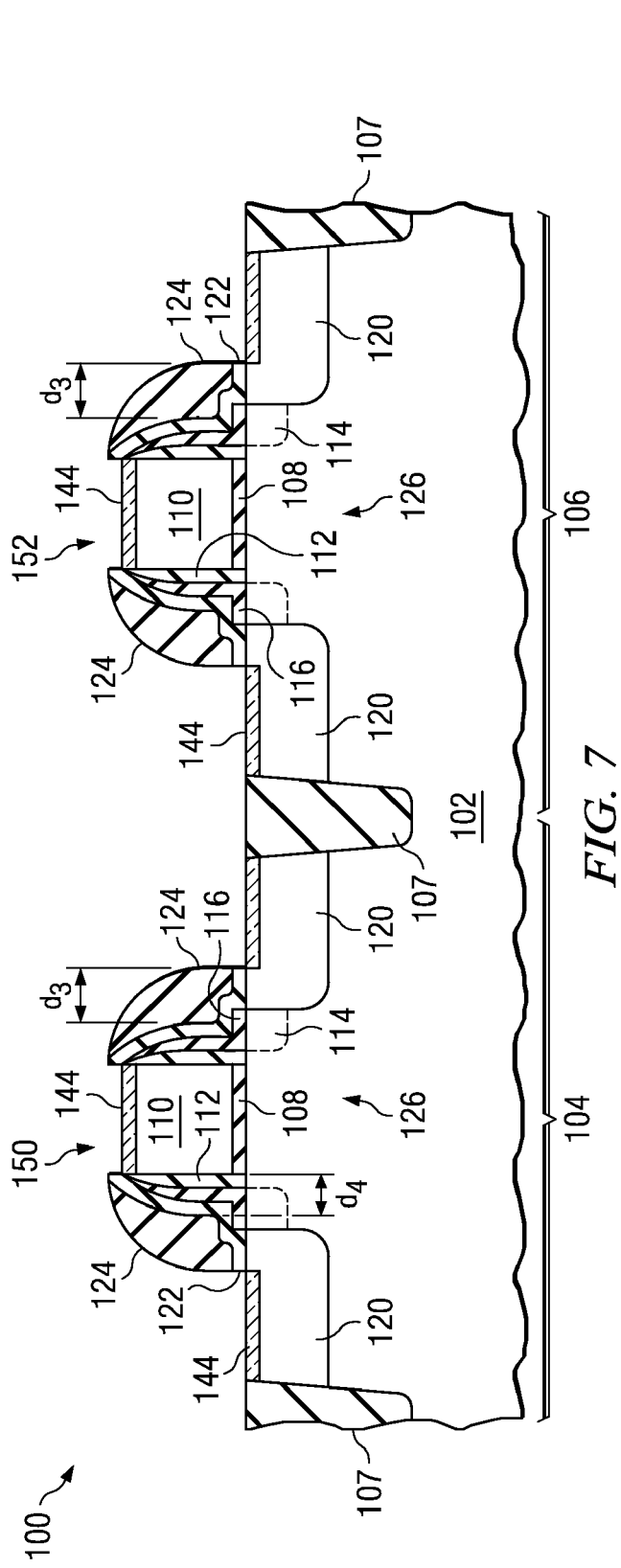
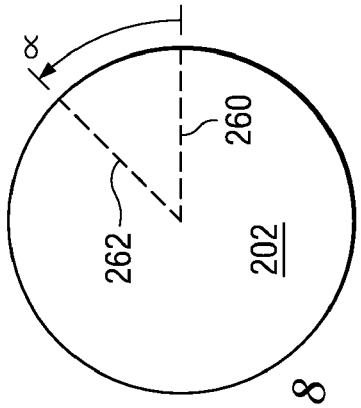
FIG. 7
FIG. 8

TRANSISTOR FABRICATION METHODS AND STRUCTURES THEREOF

TECHNICAL FIELD

The present invention relates generally to the fabrication of semiconductor devices, and more particularly to the fabrication of transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

What are needed in the art are improved methods of fabricating transistors and structures thereof.

SUMMARY OF THE INVENTION

Technical advantages are generally achieved by embodiments of the present invention, which provide novel methods of manufacturing transistors and semiconductor devices, and structures thereof.

In accordance with one embodiment of the present invention, a method of fabricating a transistor includes forming a gate dielectric over a workpiece, forming a gate over the gate dielectric, and forming a stress-inducing material over the gate, the gate dielectric, and the workpiece. Sidewall spacers are formed from the stress-inducing material on sidewalls of the gate and the gate dielectric.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 7 show cross-sectional views of a semiconductor device at various stages of manufacturing in accordance with an embodiment of the present invention, wherein sidewall spacers are formed from a stress-inducing material on sidewalls of a gate and gate dielectric of transistors;

FIG. 8 shows a top view of a semiconductor wafer rotated to achieve a <1,0,0> orientation in accordance with an embodiment of the present invention;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
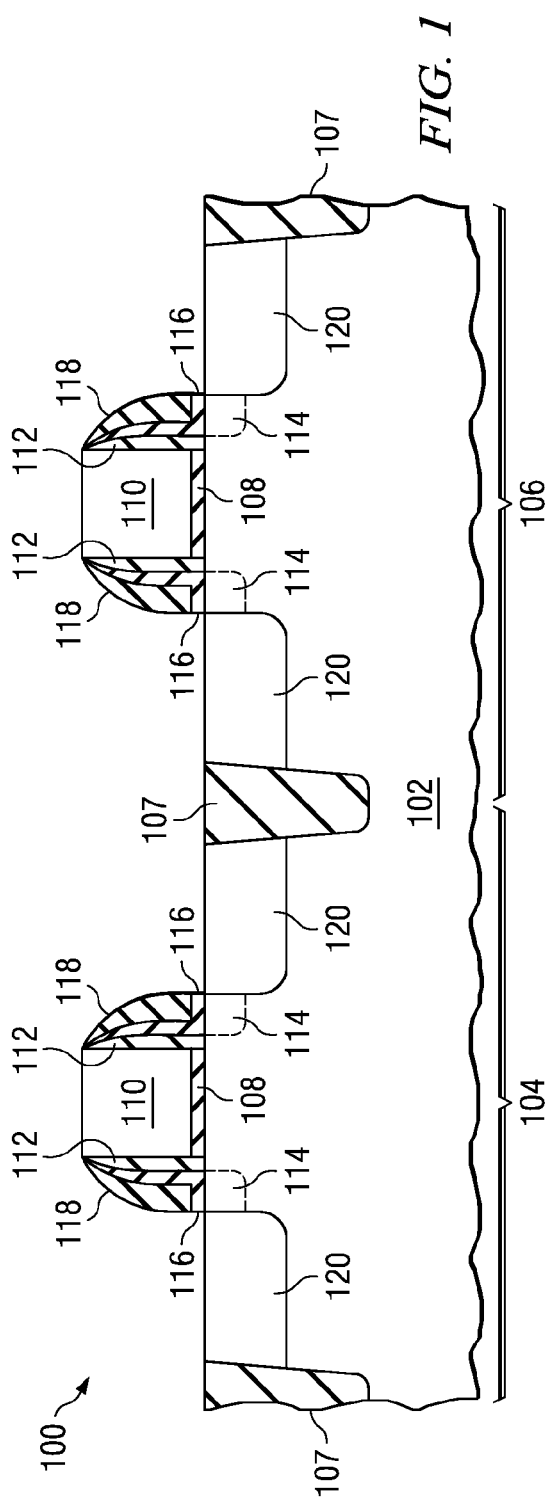

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in complementary metal oxide semiconductor (CMOS) two-transistor device applications. Embodiments of the present invention may also be implemented in single transistor devices, for example. Embodiments of the invention may also be implemented in many types of semiconductor applications, such as such as in memory devices, logic devices, and other applications that utilize transistor devices, for example.

In some transistor applications, it is desirable to introduce stress in the channel region of the transistor in order to increase the mobility of semiconductor carriers such as electrons and holes. Thus, what are needed in the art are methods of manufacturing transistors and structures thereof wherein stress is introduced to the channel regions.

Embodiments of the present invention achieve technical advantages by forming sidewall spacers of transistors that comprise a stress-inducing material. The stress-inducing sidewall spacers are placed in close proximity to the channel region, resulting in a higher stress transfer and improving device performance.

FIGS. 1 through 7 show cross-sectional views of a semiconductor device 100 at various stages of manufacturing in accordance with an embodiment of the present invention, wherein sidewall spacers are formed from a stress-inducing material on sidewalls of a gate and gate dielectric of transistors. To manufacture the semiconductor device 100, first, a workpiece 102 is provided. The workpiece 102 may include a semiconductor substrate, wafer, or body comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples. The workpiece 102 may comprise a semiconductor material having a crystalline orientation of <1,1,0> in the embodiment shown in FIGS. 1 through 7, for example.

The workpiece 102 includes a first region 104 and a second region 106. At least one first transistor will be formed in the first region 104 and at least one second transistor will be formed in the second region 106 in accordance with embodiments of the present invention. There may be a plurality of first regions 104 and a plurality of second regions 106 formed across a surface of the workpiece 102, not shown. Only one first transistor is shown in the first region 104, and only one second transistor is shown in the second region 106 of the workpiece 102 in the drawings herein; however, in accordance with embodiments of the present invention, a plurality of first transistors may be formed in the first region 104 and a plurality of second transistors may be formed in the second region 106, for example.

Isolation regions 107 are formed in the workpiece 102 in the first region 104 and the second region 106, as shown. Some of the isolation regions 107 may be formed between the first region 104 and the second region 106, for example. The isolation regions 107 may comprise shallow trench isolation (STI) regions, deep trench (DT) isolation regions, field oxide isolation regions, or other insulating regions, as examples. The isolation regions 107 may be formed by depositing a hard mask (not shown) over the workpiece 102 and forming trenches in the workpiece 102 and the hard mask using a lithography process. For example, the isolation regions 107 may be formed by depositing a photoresist, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is removed, and the trenches are then filled with an insulating material such as an oxide or nitride, or multiple layers and combinations thereof, as examples. The hard mask may then be removed. Alternatively, the isolation regions 107 may be formed using other methods and may be filled with other materials.

A gate dielectric material 108 is deposited over the workpiece 102 and the isolation regions 107. The gate dielectric material 108 may comprise about 20 nm or less of an oxide such as $SiO_2$, a nitride such as $Si_3N_4$, a high-k dielectric material having a dielectric constant greater than 3.9, or combinations and multiple layers thereof, as examples. Alternatively, the gate dielectric material 108 may comprise other dimensions and materials, for example. The gate dielectric material 108 may be formed using thermal oxidation, chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used.

A gate material 110 is deposited over the gate dielectric material 108. The gate material 110 may comprise an electrode material. The gate material 110 may comprise a thickness of about 150 nm or less, for example. The gate material 110 may comprise a semiconductor material, such as polysilicon or amorphous silicon, a metal, and/or combinations or multiple layers thereof, as examples. Alternatively, the gate material 110 may comprise other dimensions and materials, for example. The gate material 110 may be formed by CVD, PVD, or other suitable deposition methods, for example. The gate material 110 may optionally be implanted with dopants; e.g., the gate material 110 may be predoped or may be doped later, at the same time source and drain regions 114/120 are implanted with dopants.

An optional hard mask (not shown) may be deposited over the gate material 110. The hard mask, if present, the gate material 110, and the gate dielectric material 108 are patterned using lithography to form a gate 110 and gate dielectric 108. For example, a layer of photosensitive material comprising a photoresist, for example, may be deposited over the gate material 110 or the hard mask. The layer of photosensitive material is patterned using lithography with the desired pattern for the gate 110 and gate dielectric 108, and the patterned layer of photosensitive material and optionally also the hard mask are used as a mask to pattern the gate 110 and the gate dielectric 108, forming a gate 110 and a gate dielectric 108 of at least one first transistor in the first region 104 of the workpiece 102 and forming a patterned gate 110 and gate dielectric 108 of at least one second transistor in the second region 104 of the workpiece 102, as shown in FIG. 1. The layer of photosensitive material and the optional hard mask are then removed.

The gates 110 may comprise a width or a gate length of about 35 to 42 nm in some embodiments, for example. The gates 110 may extend lengthwise, e.g., in and out of the paper, by about 500 nm. Alternatively, the gates 110 may comprise other dimensions depending on the particular application and the technology node used for the manufacturing of the semiconductor device 100, for example.

The workpiece 102 may be lightly doped with a dopant species to form lightly doped regions (not shown) in a top surface of the workpiece 102 proximate the gate 110 and gate dielectric 108, after the patterning of the gate 110 and the gate dielectric 108. Other implantation processes (e.g., pocket implants, halo implants, or double-diffused regions) may optionally also be performed as desired after the patterning of the gate 110 and gate dielectric 108, for example. The various implantation processes may be performed after the formation of one or more sidewall spacers 112 or 116/118, to be described further herein.

Optional first sidewall spacers 112 may be formed on sidewalls of the gate 110 and gate dielectric 108, as shown in FIG. 1. The first sidewall spacers 112 may comprise about 15 nm or less of an insulating material, such as an oxide or a nitride. The first sidewall spacers 112 may comprise silicon nitride in the embodiment shown in FIGS. 1 through 7, for example. Alternatively, the first sidewall spacers 112 may comprise silicon dioxide, for example.

The optional first sidewall spacers 112 may be formed by depositing the first sidewall spacer material over the top surface of the workpiece 102, the isolation regions 107, the top surface of the gates 110, and over the sidewalls of the gates 110 and gate dielectrics 108. The first sidewall spacer 112 material is then etched using an anisotropic etch process, removing the first sidewall spacer 112 material from the top surfaces of the workpiece 102, the isolation regions 107, and the gates 110 and leaving the first sidewall spacer 112 material on sidewalls of the gates 110 and gate dielectrics 108.

An optional shallow dopant implantation process may then be performed, forming shallow implantation regions 114 in the top surface of the workpiece 102, as shown in phantom in FIG. 1, for example.

Next, second sidewall spacers 116/118 may be formed on the sidewalls of the gates 110 and gate dielectrics 108, as shown in FIG. 1, e.g., over the first sidewall spacers 112, if present. The second sidewall spacers 116/118 are also referred to herein (e.g., in the claims) as first sidewall spacers, e.g., in embodiments wherein the first sidewall spacers 112 are not included. The second sidewall spacer 116/118 material may comprise one or more liners and may comprise two or more layers of insulating material, e.g., such as silicon nitride, silicon oxide, and/or silicon oxynitride, although other materials may also be used. The sidewall spacer 116/118 material may comprise an oxide liner 116 and a nitride layer 118 disposed over the oxide liner, as an example. The oxide liner 116 may comprise a thickness of about 5 nm, for example, although alternatively, the oxide liner 116 may comprise other dimensions. The sidewall spacer 116/118 material may be substantially conformal as-deposited, for example. The sidewall spacer 116/118 material is etched using an anisotropic or directional etch process, leaving second sidewall spacers 116/118 on the sidewalls of the gates 110 and the gate dielectrics 108, as shown in FIG. 1. The anisotropic etch process removes the sidewall spacer 116/118 material from the top surfaces of the workpiece 102, the isolation regions 107, and the gates 110, leaving the second sidewall spacers 116/118 on the sidewalls of the gate 110 and gate dielectric 108, e.g., over the first sidewall spacers 112, if present.

The sidewall spacers 116/118 may comprise downwardly-sloping sidewalls as shown due to the anisotropic etch process, for example. The sidewall spacers 116/118 may comprise a thickness along the sidewalls of the gate 110 of about 35 nm or less, although alternatively, the sidewall spacers 116/118 may comprise other dimensions.

After the formation of the sidewall spacers 116/118, which are also referred to herein as second sidewall spacers 116/118, the workpiece 102 may be implanted with a deep implantation of a dopant species proximate the second sidewall spacers 116/118, as shown at 120. The deep implantation regions 120 and the optional shallow implantation regions 114 comprise source regions and drain regions 114/120 of the first transistor in the first region 104 of the workpiece 102 and source and drain regions 114/120 of the second transistor in the second region 106 of the workpiece 102.

The workpiece 102 may optionally be annealed to cause a portion of the dopants of the dopant implantation regions 114/120 to diffuse into the adjacent workpiece 102. As an example, the workpiece 102 may be annealed at a temperature of about 1,000 C or greater, e.g., about 1,050 to 1,070 degrees C. for a few seconds, e.g., using a spike anneal. The anneal process may cause diffusion of the dopants of the dopant implantation region 114/120 into the workpiece 102, enlarging the dopant implantation regions 114/120, for example, not shown.

Figure 2:
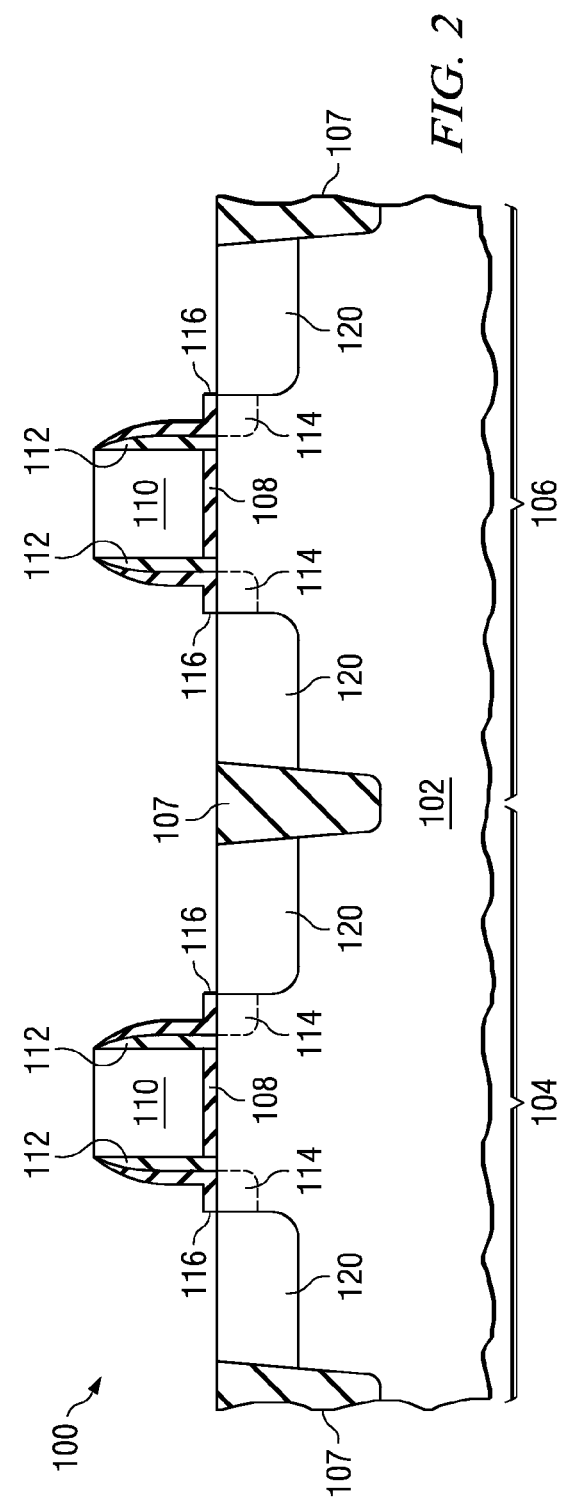

At least a portion of the second sidewall spacers 116/118 may be removed. For example, in accordance with one embodiment of the present invention, the nitride layer 118 of the second sidewall spacers 116/118 is removed or stripped, as shown in FIG. 2, leaving the oxide liner 116 remaining on the sidewalls of the gates 110 and gate dielectrics 108, or over the first sidewall spacers 112, if present. Removing at least a portion of the second sidewall spacers 116/118 advantageously results in a subsequently deposited stress-inducing material 124 (not shown in FIG. 2; see FIG. 3) being formed that is closer to the channel regions 126 disposed beneath the gate dielectrics 108 of the transistors.

Figure 3:
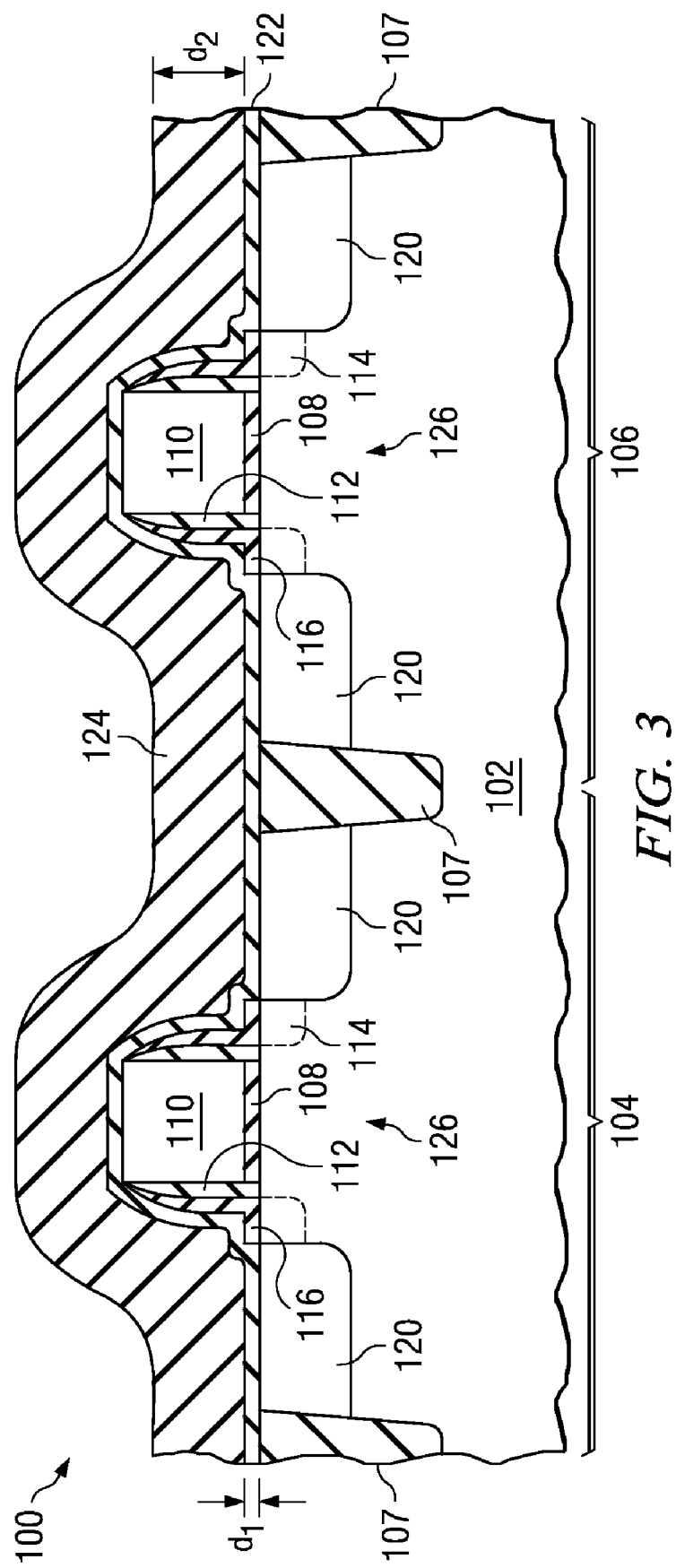

An insulating material layer 122 is formed over the workpiece 102, e.g., over the deep implantation regions 120, the isolation regions 107, the top surfaces of the gates 110, and over the remaining second sidewall spacer material 116, as shown in FIG. 3. The insulating material layer 122 comprises an oxide material. The insulating material layer 122 may comprise a low temperature oxide (LTO) material, e.g., comprising $SiO_2$ deposited at a temperature of about 700 degrees C. in some embodiments, for example. The insulating material layer 122 may comprise a thickness or dimension $d_1$ of about 10 nm, as an example, although alternatively, the insulating material layer 122 may comprise other dimensions, e.g., about 50 nm or less. Alternatively, the insulating material layer 122 may comprise other insulating materials and dimensions, and may be deposited at other temperatures, for example.

The insulating material layer 122 may function as an etch stop layer in subsequent etch processes for the stress-inducing material 124, for example. The insulating material 122 is preferably formed that is as thin as possible in some embodiments, yet thick enough to function as an etch stop, so that a stress-inducing material 124 is formed that is very close to the workpiece 102. Using an LTO process to form the insulating material layer 122 may result in a thinner material layer than if a higher temperature process were to be used to form the insulating material layer 122, for example.

A stress-inducing material 124 is formed over the insulating material layer 122, as shown in FIG. 3. The stress-inducing material 124 may comprise silicon nitride, for example, although alternatively, the stress-inducing material 124 may comprise other materials. The stress-inducing material 124 comprises a material adapted to alter a stress of the workpiece 102 in a region of the workpiece 102 proximate the stress-inducing material 124 in some embodiments. In some embodiments, for example, the stress-inducing material 124 is adapted to alter the stress of the channel region 126 disposed between source and drain regions 114/120.

The stress-inducing material 124 may comprise a thickness or dimension $d_2$ of about 40 to 50 nm, for example. Alternatively, the thickness of the stress-inducing material 124 may comprise other dimensions. The insulating material layer 122 may comprise a material with an etch selectivity (e.g., that may be etched selectively) to the material of the stress-inducing material 124, for example.

Figure 4:
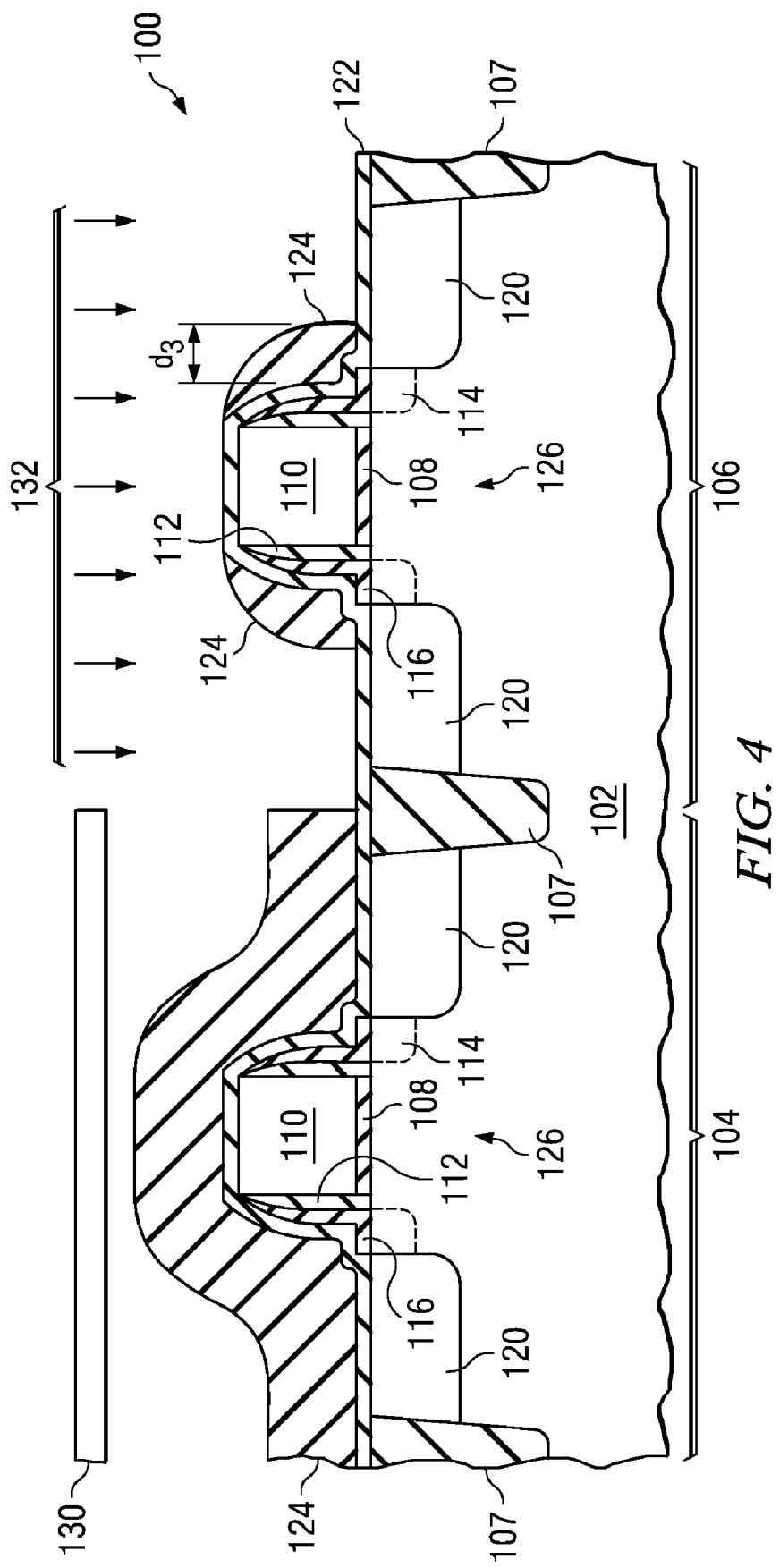

Forming the stress-inducing material 124 may comprise forming a stress-inducing material having a first thickness or dimension $d_2$. The first thickness $d_2$ of the stress-inducing material 124 in the second region 106 may be decreased or reduced to a second thickness or dimension $d_3$, as shown in FIG. 4, wherein the second thickness $d_3$ is less than the first thickness $d_2$, for example. The workpiece 102 is then annealed with the stress-inducing material 124 comprising the first thickness $d_2$ in the first region 104 and with the stress-inducing material 124 comprising the second thickness $d_3$ in the second region 106.

For example, the first region 104 of the workpiece 102 may be masked, as shown in FIG. 4, and the stress-inducing material 124 in the second region 106 is etched using an anisotropic or directional etch process 132, forming sidewall spacers comprising the stress-inducing material 124 in the second region 106 of the workpiece 102. For example, a layer of photoresist (not shown) may be formed over the stress-inducing material 124 in the first region 104 and the second region 106, and the layer of photoresist may be patterned using a lithography mask 130, leaving the layer of photoresist disposed over the first region 104 and removing the layer of photoresist from over the second region 106, exposing the stress-inducing material 124 in the second region 106. The etch process 132 is then used to remove portions of the stress-inducing material 124, forming sidewall spacers 124 on sidewalls of the gate 110 and gate dielectric 108 in the second region 106, e.g., over the insulating material layer 122 and over the optional spacer materials 116 and 112, if present. The etch process 132 may comprise a reactive ion etch (RIE) or other etch process, for example. The layer of photoresist is then removed.

The sidewall spacers 124 comprising the stress-inducing material in the second region 106 may comprise a thickness or dimension $d_3$ proximate the workpiece 102 after the etch process 132 of about 30 to 50 nm, for example, although alternatively, dimension $d_3$ may comprise other values. In some embodiments, the sidewall spacers 124 comprising the stress-inducing material in the second region may comprise a dimension $d_3$ proximate the workpiece 102 of about 100 nm or less, as another example.

Figure 5:
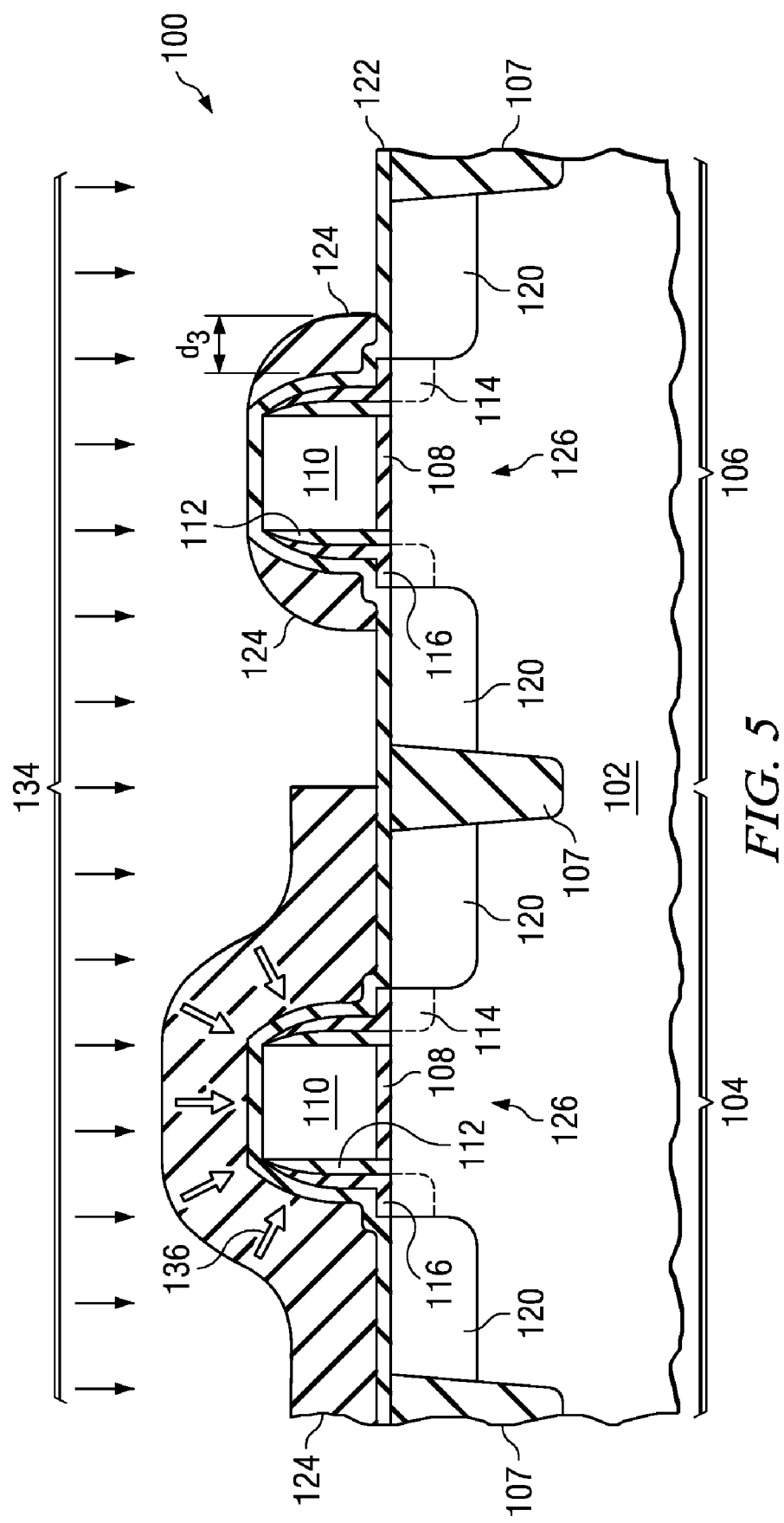

The workpiece 102 is subjected to an anneal process 134, as shown in FIG. 5. The anneal process 134 comprises a stress treatment that transfers stress 136 of the stress-inducing material 124 to portions of the workpiece 102 in the first region 104. The anneal process 134 may comprise a rapid thermal anneal (RTA), for example. The anneal process 134 may comprise a short pulse process ramping up to about 1,000 to 1,060 degrees C. for a few seconds, followed by a ramp-down of the temperature, for example. The anneal process 134 causes stress 136 of the stress-inducing material 124 to alter the stress of the channel region 126 of the transistor in the first region 104, for example. The anneal process 134 transfers stress 136 from the stress-inducing material 124 to the channel region 126 proximate the stress-inducing material 124.

Figure 6:
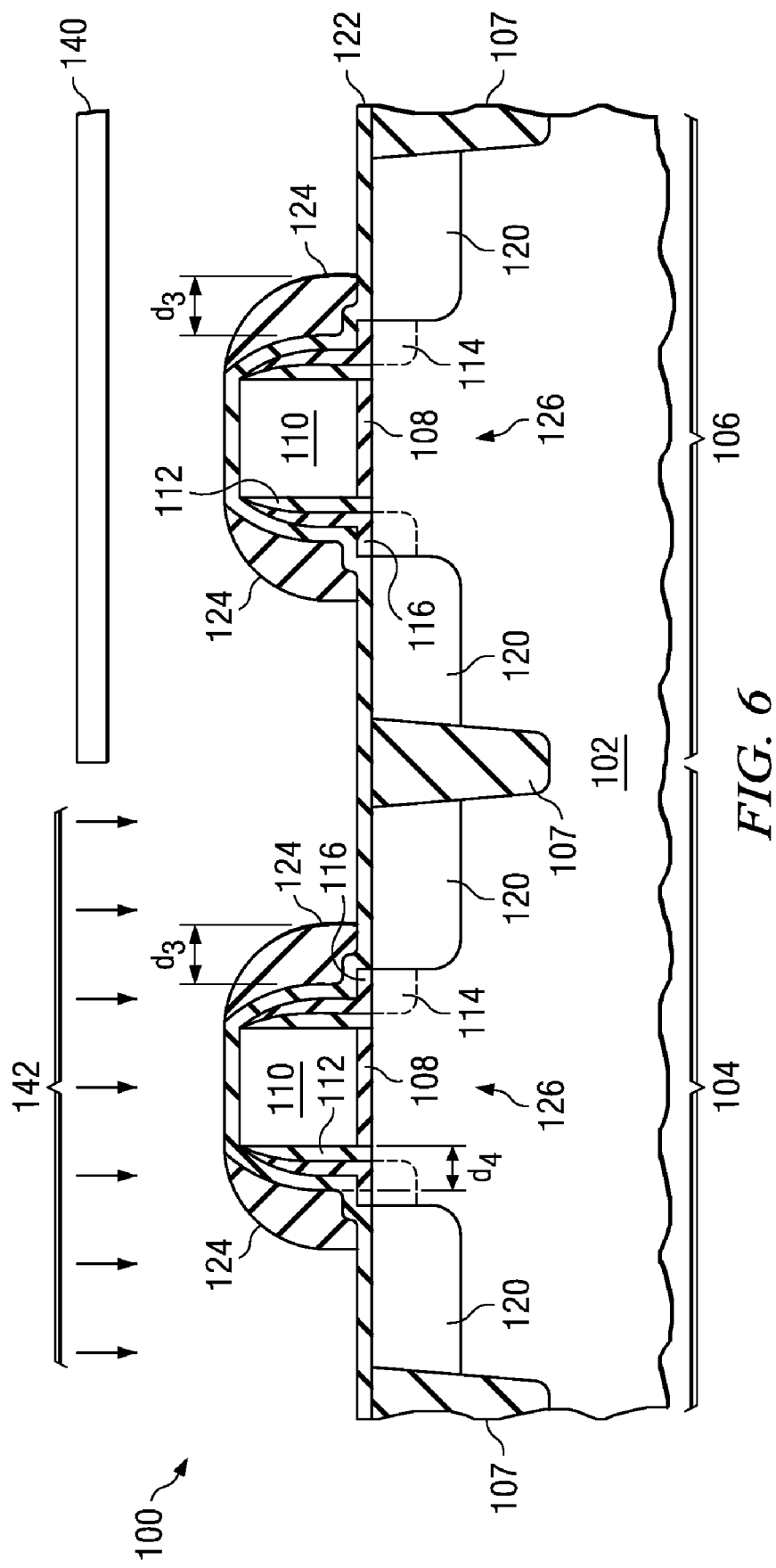

The second region 106 of the workpiece 102 is masked, as shown in FIG. 6, and the stress-inducing material 124 in the first region 106 is etched using an anisotropic or directional etch process 142, forming sidewall spacers comprising the stress-inducing material 124 in the first region 104 of the workpiece 102. For example, a layer of photoresist (not shown) may be formed over the stress-inducing material 124 in the first region 104 and over the insulating material layer 122 and over the sidewall spacers 124 in the second region 106, and the layer of photoresist may be patterned using a lithography mask 140, leaving the layer of photoresist disposed over the second region 106 and removing the layer of photoresist from over the first region 104, exposing the stress-inducing material 124. The etch process 142 is then used to remove portions of the stress-inducing material 124, forming sidewall spacers 124 on sidewalls of the gate 110 and gate dielectric 108 in the first region 104, e.g., over the insulating material layer 122 and over the optional spacer materials 116 and 112, if present. The etch process 142 may comprise a RIE or other etch process, for example. The layer of photoresist is then removed.

The sidewall spacers 124 comprising the stress-inducing material in the first region 104 may comprise a thickness or dimension $d_3$ proximate the workpiece 102 after the etch process 142 of about 30 to 50 nm, for example, although alternatively, dimension $d_3$ may comprise other values. In some embodiments, for example, the sidewall spacers 124 may comprise a dimension $d_3$ proximate the workpiece of about 100 nm or less, as another example.

The manufacturing process for the semiconductor device 100 is continued to complete the device 100. For example, in accordance with an embodiment of the present invention, exposed portions of the insulating material layer 122 are etched away. The resulting sidewall spacers 122/124 comprise the stress-inducing material 124 and the insulating material layer 122, as shown in FIG. 7. An optional silicide 144 may be formed on top surfaces of the gates 110 and the source and drain regions 114/120, also shown in FIG. 7. Transistor 150 is formed in the first region 104 and transistor 152 is formed in the second region 106 of the workpiece 102. Additional insulating materials and conductive materials, not shown, may be formed over the transistors 150 and 152. Contacts (not shown) may be formed to couple to the source and drain regions 114/120, e.g., to the silicide 144 disposed over the source and drain regions 114/120. Contacts may also be formed coupled to the gates 110, e.g., the silicide 144 disposed over the gates 110. The contacts may be coupled to conductive lines that are routed to other regions of the semiconductor device 100 and/or to contact pads, for example.

For example, a silicide region 144 may be formed over the source and drain regions 120 and the gates 110 of the transistors 150 and 152, as shown in FIG. 7. The silicide region 144 may be formed by depositing a silicidation metal over the source and drain regions 120, the stress-inducing material 124, the gates 110, and the isolation regions 107, e.g., over all exposed surfaces of the structure. The workpiece 102 is then subjected to an anneal process. The silicidation metal may comprise nickel, cobalt, or other metals, as examples. After the metal is deposited over at least the source and drain regions 120 and the gate 110, the workpiece 102 is heated, causing the metal to diffuse into semiconductive material of the source and drain region 120 and the gate 110. Silicide regions 144 comprising a silicide of the metal are formed over the semiconductive material of the source and drain regions 120 and the gate 110, as shown. After the silicide regions 144 are formed, any remaining portions of the layer of silicidation metal is then removed from the semiconductor device 100. The optional silicide regions 144 improve the conductivity and reduce the resistance of the source and drain regions 120 and the gate 110, for example. The silicide 144 may partially consume the underlying semiconductive material of the source and drain regions 120 and the gate 110, as shown.

An interlayer dielectric (ILD) layer (not shown) is then formed over the workpiece 102. The ILD layer comprises an insulating material, and may comprise a material such as borophosphosilicate glass (BPSG), silicon nitride, silicon dioxide, plasma enhanced tetraethyloxysilane (PETEOS), or other dielectric materials, as examples, although alternatively, the ILD layer may comprise other materials. The ILD layer is etched to form contact holes using lithography, and source and drain contacts and gate contacts are formed through the ILD layer by depositing conductive material to fill the contact holes and make electrical contact to the silicided 144 source/drain regions 120 and gate 110. The semiconductor device 100 may also include metallization layers (also not shown) disposed above the ILD layer and the source and drain contacts that interconnect the various components of the semiconductor device 100. Other insulating materials and conductive materials may be formed over the transistors 150 and 152 and may be patterned to make electrical contact to portions of the transistors 150 and 152, for example, not shown. The semiconductor device 100 may be annealed to activate the dopants implanted during the various implantation steps, for example.

Advantageously, the sidewall spacers 122/124 comprising the stress-inducing material 124 introduce stress to the channel region 126 of the first transistor 150 in the first region 104, but not the channel region 126 of the second transistor 152 in the second region 106, in some embodiments, because the anneal process 134 is performed after sidewall spacers 122/124 have been formed from the stress-inducing material 124 in the second region 106. Alternatively, the sidewall spacers 122/124 comprising the stress-inducing material 124 may introduce a greater stress to the channel regions 126 of the first transistor 150 in the first region 104, than the amount of stress that is introduced to the channel regions 126 of the second transistor 152 in the second region 104, in other embodiments. This is an advantage in some CMOS devices, in which it may be advantageous to introduce stress to an NFET device (such as first transistor 150 in the first region 104) but not to a PFET device (such as second transistor 152 in the second region 106).

Another advantage of embodiments of the present invention is that the sidewall spacers 122/124 comprising the stress-inducing material 124 are formed close to the channel region 126. For example, in FIGS. 6 and 7, the inner-most edge (e.g., an edge closest to the gate 110) of the stress-inducing material 124 of the sidewall spacers 124 is spaced apart from an edge of the gate dielectric 108 disposed over the channel region 126 by an amount or dimension $d_4$, wherein dimension $d_4$ comprises the thickness of the insulating material 122, the optional first sidewall spacers 112, if present, and the oxide liner 116 of the second sidewall spacers 116/118. Dimension $d_4$ may comprise about 30 nm or less in the embodiment shown in FIGS. 1 through 7, for example.

In the embodiment shown in FIGS. 1 through 7, portions of the stress-inducing material 124 are removed from the second region 106 of the workpiece 102 before the anneal process 134, forming sidewall spacers 124 in the second region 106 that comprise a thickness of dimension $d_3$ that is less than the thickness or dimension $d_2$ of the stress-inducing material 124 in the first region 104 of the workpiece 102. Thus, the channel region 126 of the transistor 152 formed in the second region 106 is affected less or is negligibly affected by the stress 136 of the stress-inducing material 124 of the sidewall spacers 122/124 during the anneal process 134.

Figure 9:
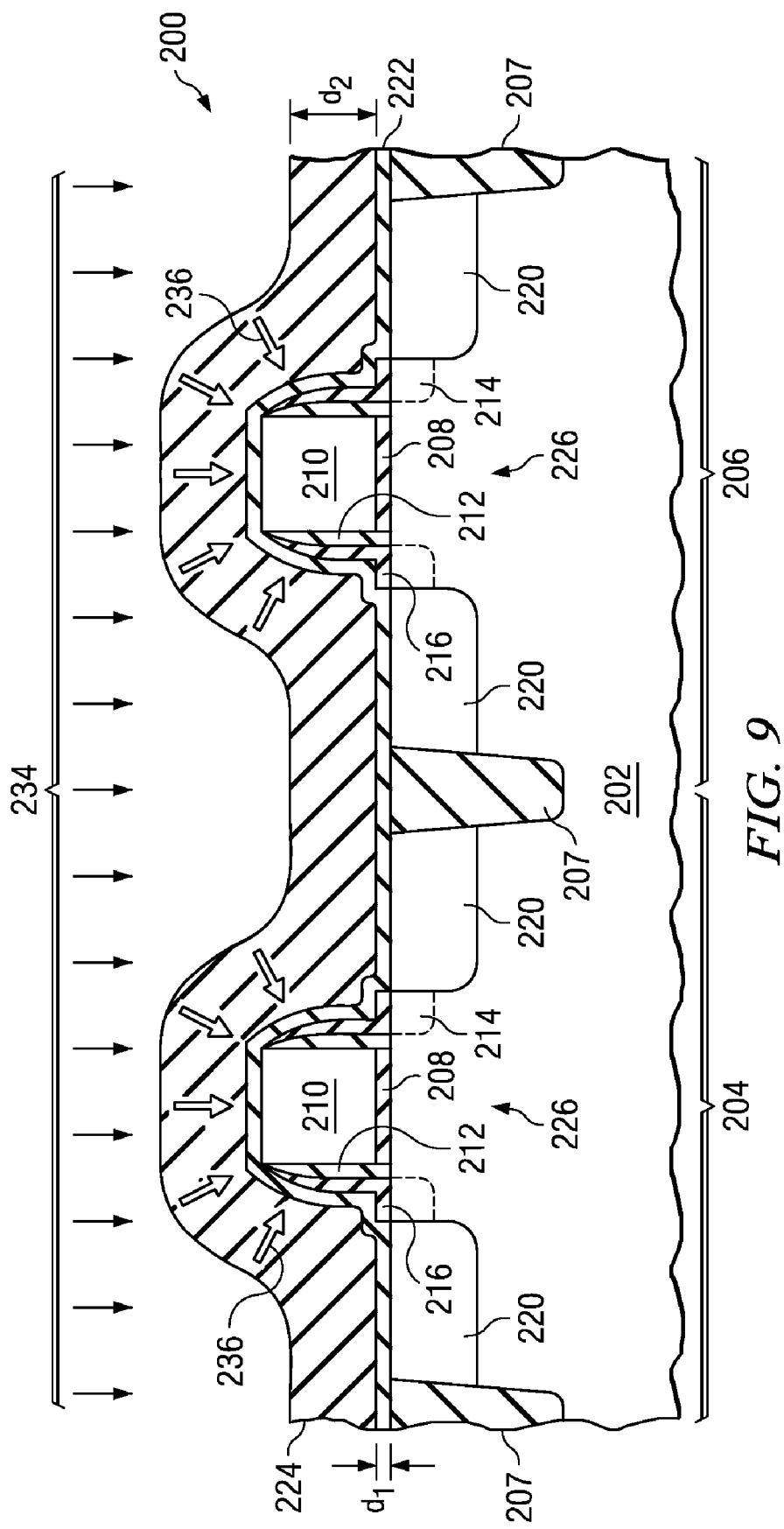
FIGS. 9 and 10 show cross-sectional views of a semiconductor device fabricated on a wafer of FIG. 8 in accordance with an embodiment of the present invention, wherein sidewall spacers are simultaneously formed from a stress-inducing material on sidewalls of a gate and gate dielectric of a plurality of transistors.
Figure 10:
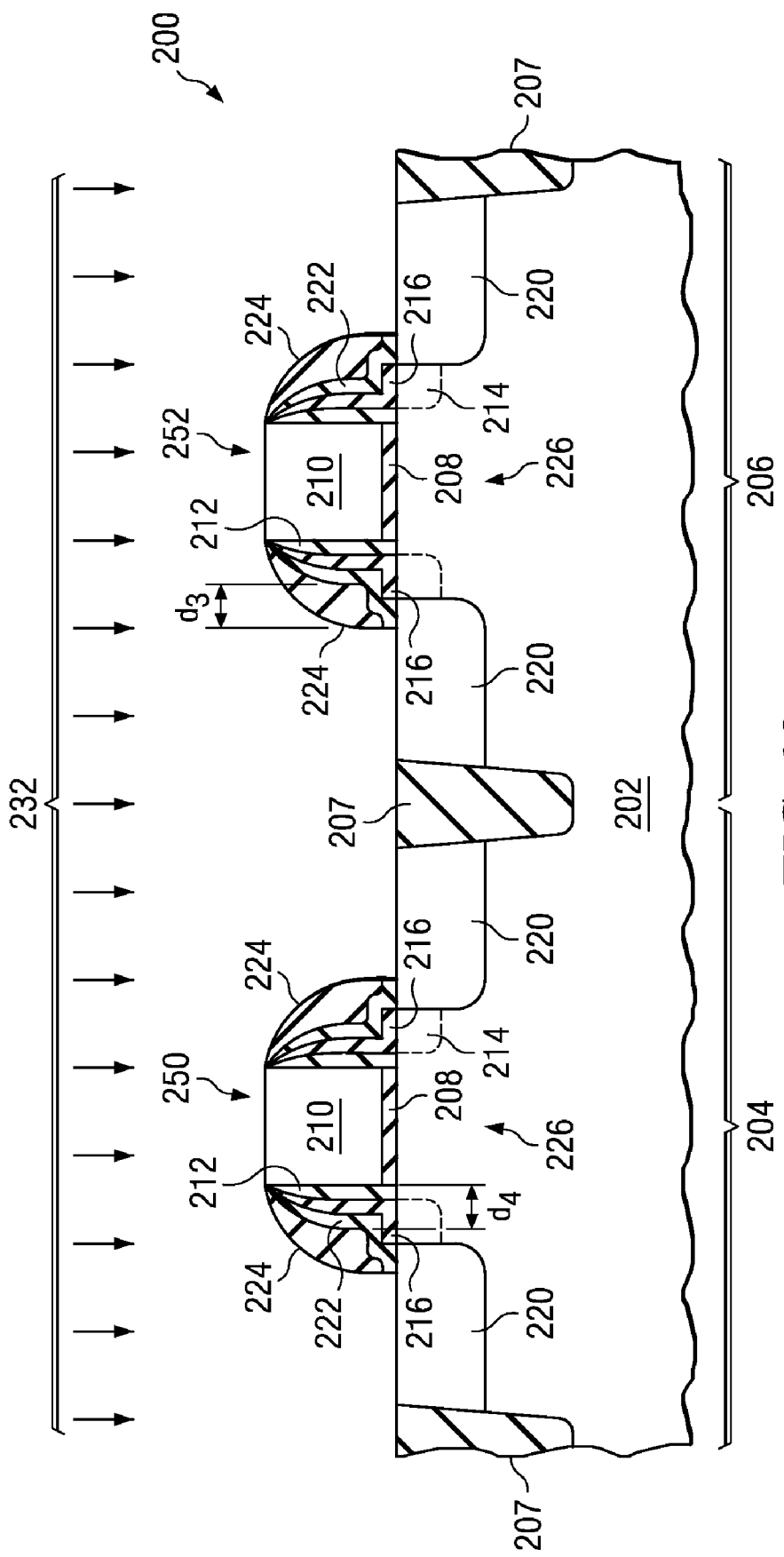

The workpiece 102 may comprise a crystalline orientation of <1,1,0> in the embodiment shown in FIGS. 1 through 7. In a second embodiment of the present invention, shown in FIGS. 8 through 10, the workpiece comprises a rotated substrate, which results in a second transistor being formed in the second region that is less affected by stress of the stress-inducing material, and the use of lithography masks 130 and 140 is advantageously not required. Like numerals are used for the various elements that were described in FIGS. 1 through 7. To avoid repetition, each reference number shown in FIGS. 8 through 10 is not described again in detail herein. Rather, similar materials x02, x04, x06, x08, etc. . . . are used to describe the various material layers shown as were used to describe FIGS. 1 through 7, where x=1 in FIGS. 1 through 7 and x=2 in FIGS. 8 through 10. As an example, the exemplary and alternative materials and dimensions described for the stress-inducing material 124 in the description for FIGS. 3 through 7 may also used for the stress-inducing material 224 shown in FIGS. 9 and 10.

The workpiece 202 may comprise a crystalline orientation of <1,1,0> when rotated at position 260 in FIG. 8, which shows a top view of a workpiece 202 or substrate. If the workpiece 202 is rotated by an angle α to a position 262 before fabricating the semiconductor device 200, the crystalline orientation of the workpiece 202 may be <1,0,0>, for example. Angle α may comprise about 45 degrees, as an example. Thus, the workpiece 202 in this embodiment may comprise a semiconductor wafer or substrate rotated to achieve a <1,0,0> orientation, although alternatively, other crystalline orientations may also be used.

The manufacturing process for the semiconductor device 200 may comprise similar processing steps as described for the first embodiment with respect to FIGS. 1 through 3. For example, FIGS. 9 and 10 show cross-sectional views of a semiconductor device 200 fabricated on a wafer or workpiece 202 of FIG. 8 in accordance with an embodiment of the present invention, wherein sidewall spacers 222/224 are simultaneously formed from a stress-inducing material 224 on sidewalls of a gate 210 and gate dielectric 208 of a plurality of transistors 250 and 252. A portion of the second sidewall spacers (e.g., nitride layer 118 of FIG. 1) is removed, leaving a portion 216 of the second sidewall spacers left remaining over the gate 210 and gate dielectric 208, e.g., over the first sidewall spacers 212, if present. The insulating material layer 222 is deposited, and the stress-inducing material 224 is formed over the insulating material 224.

After the formation of the stress-inducing material 224, as shown in FIG. 9, the workpiece 202 is annealed using an anneal process 234, without first anisotropically etching the stress-inducing material 224 in the second region 206 of the workpiece 202, as in the first embodiment shown in FIGS. 1 through 7.

The anneal process 234 comprises an anneal process described for the anneal process 134 in FIG. 5. The anneal process 234 comprises a stress treatment that transfers stress 236 of the stress-inducing material 224 to portions of the workpiece 202. However, in this embodiment, sidewall spacers are not formed first in the second region 206 from the stress-inducing material 224; thus, stress 236 is introduced in the first region 204 and also the second region 206. The anneal process 234 causes stress 236 of the stress-inducing material 224 to alter the stress of the channel regions 226 of the transistors both in the first region 204 and the second region 206. However, because of the rotation of the substrate or workpiece 202, the electrical characteristics of the transistor 252 in the second region 206 are not affected by, or are much less affected by, the stress 236 than the transistor 250 in the first region 204 is affected by the stress 236.

Without masking the workpiece 202, an anisotropic etch process 232 is used to form sidewall spacers 222/224 comprising the stress-inducing material 224 and the insulating material layer 222, as shown in FIG. 10. The processing of the semiconductor device 200 is then continued as described with reference to FIG. 7, and the manufacturing process for the semiconductor device 200 is then continued to complete the fabrication of the device 200.

Because the substrate 202 is rotated in the embodiment shown in FIGS. 8 through 10, introducing stress 236 to transistors 250 and 252 in regions 204 and 206 of the workpiece 202, respectively, does not deleteriously affect the performance of transistor 252. For example, transistor 250 may comprise an NFET and transistor 252 may comprise a PFET of a CMOS device. The performance of the NFET 250 is improved by the sidewall spacers 222/224 including the stress-inducing material 224, yet the performance of the PFET 252 may not be affected, in some embodiments. The rotated orientation of the substrate 202 alters the influence of mechanical stress on channel mobility in NFET and PFET devices differently. While the NFET 250 mobility remains sensitive to mechanical stress 236 in the channel direction, the PFET 252 mobility is almost insensitive to the stress 236. Hence, the PFET 252 electrical performance is not adversely affected by the stress 236.

Figure 11:
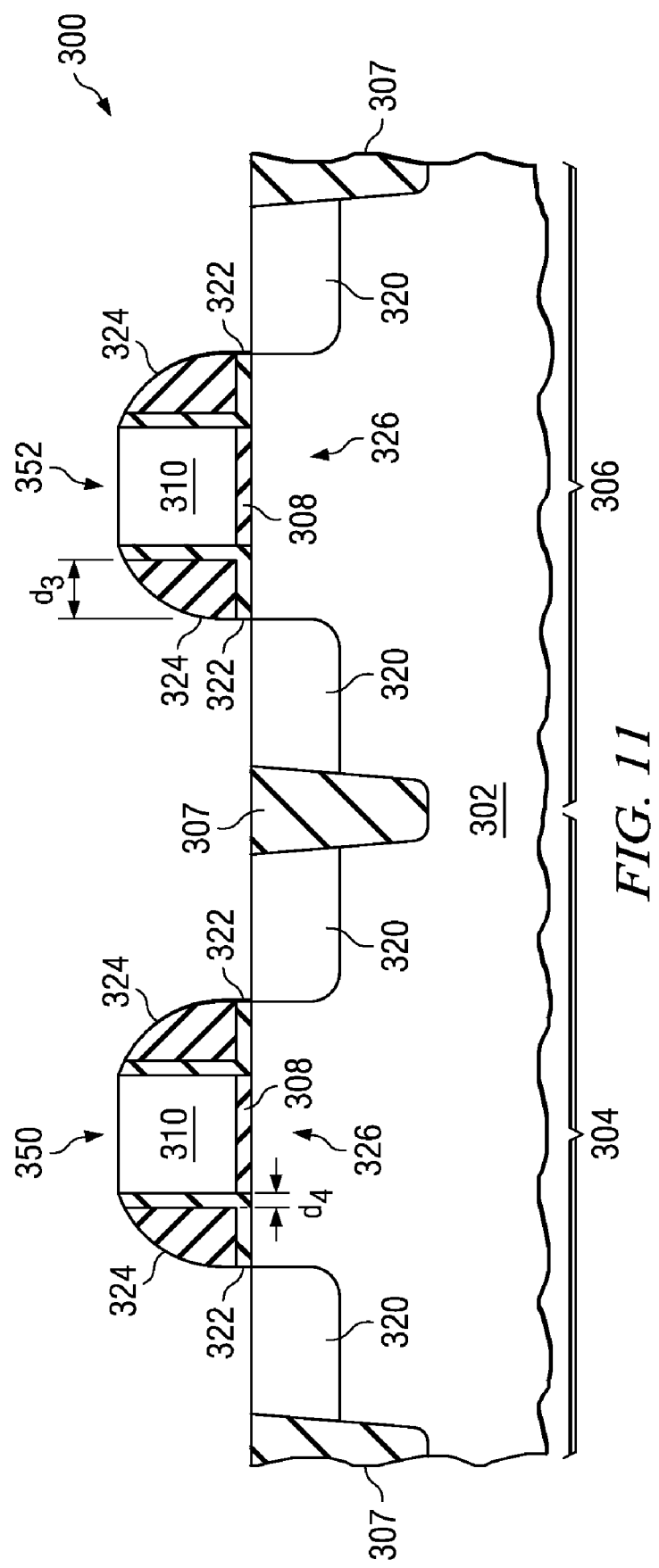
FIG. 11 is a cross-sectional view of another embodiment of the present invention, wherein a single insulating material layer is formed over the gate and gate dielectric of transistors, before forming the stress-inducing material and forming sidewall spacers.

In FIG. 11, a third embodiment of the present invention is shown in a cross-sectional view. Again, like numerals are used for the various elements in FIG. 11 that were used to describe the previous figures, and to avoid repetition, each reference number shown in FIG. 11 in not described again in detail herein.

In the embodiment shown in FIG. 11, sidewall spacers such as sidewall spacers 112 and 116 in FIG. 7 or sidewall spacers

212 and 216 in FIG. 10 may comprise temporary sidewall spacers that are removed before forming the stress-inducing material 324. Alternatively, the first sidewall spacers 112 and the second sidewall spacers 116/118 may not be used, for example. An insulating material layer 322 is formed over the workpiece 302 and over the gate 310 and gate dielectric 308. The insulating material layer 322 may comprise a single oxide layer that is formed over the gate 310 and gate dielectric 308 of the transistors 350 and 352. The stress-inducing material 324 is formed over the insulating material layer 322. The stress-inducing material 324 and the insulating material layer 322 are anisotropically etched, forming sidewall spacers 322/324 that include the stress-inducing material 324 and the insulating material layer 322, as shown in FIG. 11.

The sidewall spacers 322/324 comprising the stress-inducing material 324 and the insulating material layer 322 may be formed using the method shown in FIGS. 1 through 7, e.g., by masking the first region 304, etching the stress-inducing material 324 and the insulating material layer 322 to form sidewall spacers 322/324 in the second region 306, annealing the workpiece 302 to create stress in the channel region 326 of the first transistor 350 in the first region 304, masking the second region 306, and etching the stress-inducing material 324 and the insulating material layer 322 to form sidewall spacers 322/324 in the first region 304. Alternatively, the workpiece 302 may be rotated, and the transistors 350 and 352 may be fabricated using the method shown in FIGS. 8 through 10, using a single anneal process and a single etch process to form the sidewall spacers 322/324 that include the stress-inducing material 324, for example.

In this embodiment, the dimension $d_4$ comprising the lateral distance from the stress-inducing material 324 to the channel region 326 is minimized, comprising the thickness of the insulating material layer 322. Dimension $d_4$ may comprise about 20 nm or less in this embodiment, advantageously placing the sidewall spacers 322/324 comprising the stress-inducing material 324 closer to the channel regions 326 of the transistors 350 and 352.

The transistors 350 and 352 comprise source and drain regions 320 disposed on either side of the gate 326 in the workpiece 302. No shallow implantation regions such as regions 114 shown in FIGS. 1 through 7 are included in the embodiment shown in FIG. 11, for example. Alternatively, the semiconductor device 300 shown in FIG. 11 may also include shallow implantation regions, for example, not shown. Processing of the semiconductor device 300 is then continued as described with reference to FIG. 7.

Embodiments of the present invention may be implemented in CMOS devices comprising NMOS transistors 150, 250, and 350 and PMOS transistors 152, 252, and 352. Embodiments of the present invention may also be implemented in other multiple transistor applications. Embodiments of the present invention may also be implemented in single transistor applications, for example.

In accordance with some embodiments of the present invention, the channel regions 126, 226, or 326 of some transistors 150, 250, or 350 may be more affected by the stress 136 or 236 of the stress-inducing material 124, 224, and 324 than the channel regions 126, 226, or 326 of other transistors 152, 252, or 352 are affected by the stress 136 or 236 of the stress-inducing material 124, 224, and 324. This is achieved in some embodiments (e.g., shown in FIGS. 1 through 7) by forming sidewall spacers 122/124 in the second region 106, and then annealing 134 the workpiece 102, causing stress 136 to affect channel regions 126 in the first region 104, and either not affecting channel regions 126 in the second region 106, or affecting channel regions 126 in the second region 106 less than in the first region 104. In other embodiments, the different effects of stress in the first region 204 and the second region 206 is achieved by rotating the substrate or workpiece 202, as shown in FIGS. 8 through 10.

In some embodiments, the transistors 150, 250, and 350 affected more by the stress 136 or 236 may comprise NMOS transistors. The stress-inducing material 124, 224, and 324 may comprise a material adapted to introduce tensile stress to the channel regions 126, 226, 326 of the NMOS transistors 150, 250, and 350, which improves device 100, 200, or 300 performance, as an example.

In other embodiments, the transistors 150, 250, and 350 affected more by the stress 136 or 236 may comprise PMOS transistors. The stress-inducing material 124, 224, and 324 may comprise a material adapted to introduce compressive stress to the channel regions 126, 226, 326 of the PMOS transistors 150, 250, and 350, which improves device 100, 200, or 300 performance, as an example.

To design the semiconductor devices 100, 200, and 300, an amount of stress for the channel region 126, 226, and 336 of transistors 150 or 152, 250 or 252, or 350 or 352 may be determined, and then a stress-inducing material 124, 224, and 334 is selected that is adapted to induce the amount of stress for the channel region 126, 226, and 336 determined. Forming the stress-inducing material 124, 224, and 334 may comprise using a deposition temperature, a processing parameter, or an anneal process for forming the stress-inducing material 124, 224, and 334 to achieve the amount of stress determined, for example. Alternatively, a type of material or a thickness of the stress-inducing material 124, 224, and 334 may be selected to achieve the amount of stress determined, for example.

Embodiments of the present invention may be implemented in many types of applications where transistors are used, as described herein and shown in the figures. One example of a memory device that embodiments of the present invention may be implemented in that uses both PMOS FET's and NMOS FET's is a static random access memory (SRAM) device. A typical SRAM device includes arrays of thousands of SRAM cells, for example. Each SRAM cell may have four transistors, six transistors, or other numbers of transistors. A commonly used SRAM cell is a six-transistor (6T) SRAM cell, which has two PMOS FET's interconnected with four NMOS FET's. The novel methods of forming transistors 150, 152, 250, 252, 350, and 352 and structures thereof described herein may be used to fabricate transistors of SRAM devices and other memory devices, for example.

Embodiments of the present invention include semiconductor devices 100, 200, and 300 and transistors 150, 152, 250, 252, 350, and 352 that include sidewall spacers 122/124, 222/224, and 322/324 comprising a stress-inducing material. Embodiments of the present invention also include methods of fabricating the semiconductor devices 100, 200, and 300 and transistors 150, 152, 250, 252, 350, and 352 described herein, for example.

Advantages of embodiments of the invention include providing novel structures and methods for fabricating transistors 150, 152, 250, 252, 350, and 352 and semiconductor devices 100, 200, and 300. The sidewall spacers 122/124, 222/224, and 322/324 comprising the stress-inducing material 124, 224, and 324 may be adapted to alter the stress of channel regions 126, 226, and 326 of the transistors 150, 152, 250, 252, 350, and 352, and may also alter, e.g., improve the transistor 150, 152, 250, 252, 350, and 352 and device 100, 200, and 300 performance.

For example, altering the stress in the channel regions 126, 226, and 326 may result in increasing the channel mobility, increasing the on current $I_{on}$ or altering a threshold voltage $V_t$ of transistors 150, 152, 250, 252, 350, and 352, as examples. Alternatively, other performance parameters may be altered or improved in accordance with the stress-altering techniques described herein.

Embodiments of the present invention comprise novel stress memorization techniques (SMT) wherein the stress-inducing material 124, 224, and 324 is placed close to the channel regions 126, 226, and 326. The stress-inducing material 124, 224, and 324 of the sidewall spacers 122/124, 222/224, and 322/324 results in a higher stress transfer for transistors 150, 250, and 350 in the first region 104, 204, and 304 of the semiconductor devices 100, 200, and 300, for example.

The stress-inducing material 124, 224, and 324 of the sidewall spacers 122/124, 222/224, and 322/324 in the first region 104, 204, and 304 may produce a compressive or tensile stress in the channel regions 126, 226, and 326 in the first regions 104, 204, and 304, and the stress on the channel regions 126, 226, and 326 in the second regions 106, 206, and 306 may comprise a neutral or less compressive or tensile stress in the channel regions 126, 226, and 326 in the second regions 106, 206, and 306, for example, in some embodiments.

In the embodiment shown in FIGS. 1 through 7, the stress-inducing material 124 of the sidewall spacers 122/124 in the first region 104 during the anneal process 134, shown in FIG. 5, results in a homogeneous SMT nitride material 124 that is located close to the channel region 126 during the anneal process, for example.

Embodiments of the present invention are easily implementable in existing manufacturing process flows, with a small or reduced number of additional processing steps being required, for example. The lithography masks 130 and 140 may comprise dedicated lithography masks for implementing embodiments of the invention described herein. Alternatively, the lithography masks 130 and 140 may comprise masks used for other processes for the semiconductor devices 100, 200, and 300, such as for etch processes, implantation processes, for forming spacer materials, or defining silicide areas, as examples.

The sidewall spacers 122/124, 222/224, and 322/324 comprising the stress-inducing material 124, 224, and 324 introduce stress to the channel regions 126, 226, and 326 of transistors 150, 152, 250, 252, 350, and 352. Because at least a portion (e.g., layer 118 shown in FIG. 1) of the second sidewall spacers 116/118 is removed before forming the sidewall spacers 122/124, 222/224, and 322/324 comprising the stress-inducing material 124, the sidewall spacers 122/124, 222/224, and 322/324 comprising the stress-inducing material 124, 224, and 324 are advantageously placed closer to the channel regions 126, 226, and 326, resulting in a higher stress transfer for transistors 150, 250, and 350 in the first region 104, 204, and 304 of the semiconductor devices 100, 200, and 300, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a transistor, the method comprising:
    forming a gate dielectric material over a workpiece having a first and a second region;
    forming a gate material over the gate dielectric material;
    patterning the gate material and the gate dielectric material to form gates and gate dielectrics of a first transistor in the first region and a second transistor in the second region of the workpiece;
    forming a stress-inducing material over the gates, the gate dielectrics, and the workpiece;
    forming sidewall spacers from the stress-inducing material on sidewalls of the gate and the gate dielectric of the second transistor by removing the stress inducing material in the second region but not in the first region; and
    inducing more stress in a first channel region of the first transistor than in a second channel region of the second transistor by annealing the workpiece.

2. The method according to claim 1, wherein aiming the stress-inducing material comprises forming a nitride material.

3. The method according to claim 1, further comprising determining an amount of stress for the first channel region of the first transistor and the second channel region of the second transistor, and wherein forming the stress-inducing material comprises forming a material that induces the amount of stress for the first channel region and the second channel region determined.

4. The method according to claim 3, wherein forming the stress-inducing material comprises: using a deposition temperature, a processing parameter, or an anneal process of forming the stress-inducing material; or selecting a type of material or a thickness of the stress-inducing material, to achieve the amount of stress determined.

5. The method according to claim 1, wherein forming the sidewall spacers from the stress-inducing material of the second transistor comprises anisotropically etching the stress-inducing material.

6. The method according to claim 1, further comprising forming an insulating material layer over the gates and the gate dielectrics, before forming the stress-inducing material, wherein forming the sidewall spacers of the second transistor comprises forming the sidewall spacers from the stress-inducing material and the insulating material layer.

7. The method according to claim 1, further comprising:
    forming inner sidewall spacers on sidewalls of the gates and the gate dielectrics, before forming the sidewall spacers comprising the stress-inducing material;
    forming source and drain regions in the workpiece; and
    removing at least a portion of the inner sidewall spacers, before forming the stress-inducing material.

8. A method of manufacturing a semiconductor device, the method comprising:
    providing a workpiece, the workpiece comprising a first region and a second region;
    forming a gate dielectric material over the workpiece;
    forming a gate material over the gate dielectric material;

patterning the gate material and the gate dielectric material to form gates and gate dielectrics of at least one first transistor in the first region and at least one second transistor in the second region of the workpiece;

forming a stress-inducing material over the gates, the gate dielectrics, and the workpiece;

forming second sidewall spacers from the stress-inducing material on the at least one second transistor by removing the stress-inducing material over the second region;

annealing the workpiece after forming the second sidewall spacers; and forming first sidewall spacers from the stress-inducing material on the at least one first transistor in the first region after the annealing.

9. The method according to claim 8, wherein forming the sidewall spacers from the stress-inducing material on the at least one second transistor in the second region comprises masking the first region and anisotropically etching the stress-inducing material in the second region, and wherein forming the sidewall spacers from the stress-inducing material on the at least one first transistor in the first region comprises masking the second region and anisotropically etching the stress-inducing material in the first region.

10. The method according to claim 8, wherein providing the workpiece comprises a substrate comprising a <1,0,0> orientation.

11. The method according to claim 8, further comprising forming inner sidewall spacers on the sidewalls of the gates and the gate dielectrics, before forming the stress-inducing material, wherein forming the first and second sidewall spacers comprises forming sidewall spacers from the stress-inducing material over the inner sidewall spacers.

12. The method according to claim 11, further comprising implanting a dopant into the workpiece, after forming the inner sidewall spacers, forming at least portions of source and drain regions of the at least one first transistor and the at least one second transistor.

13. The method according to claim 12, further comprising removing at least a portion of the inner sidewall spacers, after implanting the dopant into the workpiece, and before forming the stress-inducing material.

14. The method according to claim 8, further comprising forming an oxide material over the workpiece and forming oxide sidewall spacers from the oxide material, before forming the stress-inducing material.

15. The method according to claim 14, further comprising implanting a dopant into the workpiece, after forming the oxide sidewall spacers, forming at least portions of source regions or drain regions of the at least one first transistor and the at least one second transistor.

16. The method according to claim 8, further comprising forming an insulating material layer over the gates and the gate dielectrics, before forming the stress-inducing material, wherein forming the first and second sidewall spacers comprises forming the sidewall spacers from the stress-inducing material and the insulating material layer, wherein forming the insulating material layer comprises forming an oxide material using a low temperature deposition process comprising a temperature of about 700 degrees C. or less.

17. A method of manufacturing a CMOS device, the method comprising:

forming a gate dielectric material and a gate material over a workpiece, the workpiece having a first and a second region;

patterning the gate dielectric material and the gate material in the first region to form an NMOS transistor and patterning the gate dielectric material and the gate material in the second region to form a PMOS transistor;

forming a stress-inducing material over the gates, the gate dielectrics, and the workpiece;

forming first sidewall spacers from the stress-inducing material on the PMOS transistor but not on the NMOS transistor;

annealing the workpiece; and forming second sidewall spacers from the stress-inducing material on the NMOS transistor after the annealing.

18. The method according to claim 17, further comprising forming inner sidewall spacers on the sidewalls of the gates and the gate dielectrics of the first and second transistor, before forming the stress-inducing material, wherein forming the first and second sidewall spacers comprises forming sidewall spacers from the stress-inducing material over the inner sidewall spacers.

19. The method according to claim 17, further comprising implanting a dopant into the workpiece, after forming the inner sidewall spacers, forming at least portions of source and drain regions of the first transistor and the second transistor.

20. The method according to claim 19, further comprising removing at least a portion of the inner sidewall spacers, after implanting the dopant into the workpiece, and before forming the stress-inducing material.

21. The method according to claim 17, further comprising forming an oxide material over the workpiece and forming oxide sidewall spacers from the oxide material, before forming the stress-inducing material.

22. The method according to claim 21, further comprising implanting a dopant into the workpiece, after forming the oxide sidewall spacers, forming at least portions of source regions or drain regions of the first transistor and the second transistor.

23. The method according to claim 17, further comprising forming an insulating material layer over the gates and the gate dielectrics, before forming the stress-inducing material, wherein forming the first and second sidewall spacers comprises forming the sidewall spacers from the stress-inducing material and the insulating material layer, wherein forming the insulating material layer comprises forming an oxide material using a low temperature deposition process comprising a temperature of about 700 degrees C. or less.

* * * * *